United States Patent [19]

Sakamoto et al.

[11] 4,059,808
[45] Nov. 22, 1977

[54] DIFFERENTIAL AMPLIFIER

[75] Inventors: Yoshio Sakamoto, Kokubunji; Masahiro Yamamura, Fuchu, both of Japan

[73] Assignee: Hitachi, Ltd., Japan

[21] Appl. No.: 708,046

[22] Filed: July 23, 1976

[30] Foreign Application Priority Data

July 30, 1975 Japan .............................. 50-91922

[51] Int. Cl.² .......................................... H03F 3/45
[52] U.S. Cl. ................................. 330/257; 330/255; 330/261
[58] Field of Search .................. 330/17, 18, 20, 22, 330/30 D, 38 M, 23

[56] References Cited

U.S. PATENT DOCUMENTS

| 3,538,449 | 11/1970 | Solomon | 330/30 D |
| 3,649,926 | 3/1972 | Hill | 330/30 D |
| 3,668,538 | 6/1972 | Hearn | 330/30 D X |

OTHER PUBLICATIONS

Widlar, "Designing with Super-Beta Transistor Op-Amp ICs", EEE Mar. 1970, pp. 72-76.

Primary Examiner—James B. Mullins
Attorney, Agent, or Firm—Craig & Antonelli

[57] ABSTRACT

In a semiconductor differential amplifier comprising a differential pair of npn transistors having the emitters connected to the emitter of lateral transistors, the bases supplied with an input signal, and the collectors connected in common to one terminal of the voltage source so as to derive the output signal from the collector of the lateral transistor, the emitter voltage of each of the differential pair transistors is applied to the common base of the pnp lateral transistors through a constant voltage element consisting of a transistor or a diode. Therefore, the voltage applied between the base and the substrate of the lateral transistor is reduced and hence the tolerance to the reverse breakdown voltage is increased and simplification of the circuit structure becomes possible. Further, a sink current path is provided between the base of the pnp lateral transistor and the other terminal of the voltage source to allow a stabilized bias current to flow through the differential amplifier.

6 Claims, 5 Drawing Figures

DIFFERENTIAL AMPLIFIER

BACKGROUND OF THE INVENTION

1. FIELD OF THE INVENTION

This invention relates to a differential amplifier and more particularly to a differential amplifier comprising an input stage including npn transistors and pnp lateral transistors.

2. DESCRIPTION OF THE PRIOR ART

Conventionally, the circuit of FIG. 5 has been used in the $\mu A$ 741 type operational amplifier, commercially available from Fairchild Inc., U.S.A., and has been known as an input circuit for operational amplifiers produced in a monolithic semiconductor integrated circuit form. See, for example, U.S. Pat. No. 3,586,987 issued on June 22, 1971. The input stage of this circuit is formed of integrated npn transistors $Q_1$ and $Q_2$ having a high current amplification factor and integrated pnp lateral transistors $Q_3$ and $Q_4$ having a low current amplification factor for minimizing the bias current. Since the reverse breakdown voltage of the base-emitter junction $BV_{EBO}$ of the integrated lateral pnp transistor is high, whereas that of the npn transistor is relatively poor, the range of the differential input voltage can be set wide. As the pnp lateral transistors $Q_3$ and $Q_4$ are biased with a constant sink current $I_B$ and if the base-emitter voltage $V_{BE}$ matching between the differential pair transistors $Q_1$ and $Q_2$ and the transistors $Q_7$ and $Q_8$ serving as the active loads thereof are arranged well, the collector currents through the respective elements become substantially equal. The active loads of high resistance are provided with the transistors $Q_7$ and $Q_8$ for obtaining high gain. The introduction of these active loads into the design of monolithic operational amplifiers is disclosed by R. J. Widlar in "Design techniques for monolithic operational amplifiers" IEEE J. Solid-State Circuits SC-4, No. 4, p. 184, Aug. 1969.

Generally, the dispersion or unevenness in the characteristics of lateral transistors is large. Hence, a diode $Q_5'$, formed by a pnp transistor having its collector connected to its base, and a transistor $Q_6'$ are used to effect current feed-back for stabilizing the operation of the lateral transistors $Q_3$ and $Q_4$. The diode $Q_5'$ which may practically be a diode-connection transistor, detects the current flowing through the transistors $Q_1$ and $Q_2$ and settles the collector current of the transistor $Q_6'$ in correspondence thereto. Since a sink current $I_B$ is controlled by the base input of an npn transistor $Q_9$ and is held constant, and the differential current of the collector current of the transistor $Q_6'$ and the sink current $I_B$ controls the base current of the transistors $Q_3$ and $Q_4$, the bias stability and the common mode signal rejection ratio (CMRR) increase. Further, the prevention of oscillation can be made easily by connecting a phase-compensating capacitor between the bases of the transistors $Q_7$ and $Q_8$ and $-V_{EE}$ terminal of the transistor $Q_7$ ($Q_8$) as the active load.

In this circuit, however, since the source voltage $V_{CC}$ is directly applied to the lateral transistors $Q_5'$ and $Q_6'$ for the purpose of current feed-back (in the case where the diode $Q_5'$ is a diode connection transistor), a high voltage is applied between the base and the substrate of these transistors and there arises a problem in the reverse breakdown voltage. Further, there are limitations in the modification of the circuit structure and a simplification of the circuit is hardly ever made.

SUMMARY OF THE INVENTION

This invention is made to solve the above problems and therefore an object of this invention is to provide a differential amplifier suited for semiconductor integrated circuits in which the voltage applied to the lateral transistors is reduced while keeping the high common mode signal rejection ratio, stability and high frequency characteristics.

Another object of this invention is to provide a differential amplifier suited for semiconductor integrated circuits capable of various circuit modifications and simplifications.

According to one aspect of this invention, there is provided a differential amplifier comprising differential pair npn transistors each having a base supplied with an input signal and an emitter, at least one lateral pnp transistor having an emitter connected to the emitter of one of said npn transistors and a collector supplying an output, the emitter voltage of the other of said npn transistors being applied to the base of said pnp transistor through a constant voltage element, and a current path being provided between the base of said pnp transistor and the negative terminal of a voltage source.

The above and other objects, features and advantages of this invention will become apparent from the following detailed description of the preferred embodiments of the invention when taken in conjunction with the accompanying drawings.

BRIEF DESCRIPTION OF THE DRAWINGS

Throughout the drawings, similar references denote similar parts.

DESCRIPTION OF THE PREFERRED EMBODIMENTS

Hereinbelow, description will be made of the preferred embodiments in detail referring to the accompanying drawings.

Figure 1:
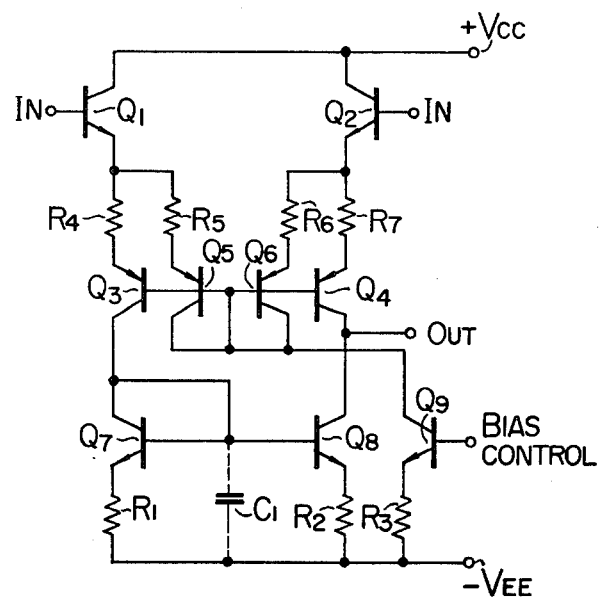
FIG. 1 is a circuit diagram of a differential amplifier according to an embodiment of this invention.

FIG. 1 is a circuit diagram of a differential amplifier produced in the form of silicon semiconductor integrated circuits according to an embodiment of this invention.

The input stage of the differential amplifier utilizes complementary elements and comprises differential pair npn transistors $Q_1$ and $Q_2$ of high current amplification factor, each having an emitter, pnp lateral transistors $Q_3$ and $Q_4$ of low current amplification factor, each having an emitter, and resistors $R_4$ and $R_7$ connected between the emitters of the npn transistors and the pnp transistors, respectively. Other npn transistors $Q_7$ and $Q_8$ are connected to the collector of the lateral pnp transistors $Q_3$ and $Q_4$ as the active loads. The collector and the base of the transistor $Q_7$ are connected together and the base thereof is connected to the base of the transistor $Q_8$ for driving transistors $Q_7$ and $Q_8$ with a constant current. The emitters of the transistors $Q_7$ and $Q_8$ are connected to a negative terminal $-V_{EE}$ through emitter resistors $R_1$ and $R_2$. The bias voltage for the pnp lateral transistors $Q_3$ and $Q_4$ is controlled by pnp lateral transistors $Q_5$ and $Q_6$. The emitters of the transistors $Q_5$ and $Q_6$ are connected to the emitters of the npn transistors $Q_1$ and $Q_2$ through emitter resistors $R_5$ and $R_6$, the bases of transistors $Q_5$ and $Q_6$ to the bases of the pnp transistors $Q_3$ and $Q_4$ in common, and the collectors of transistors $Q_5$ and $Q_6$ to their common bases and to the collector of a transistor $Q_9$. The transistor $Q_9$ forms a constant sinking current circuit providing a constant sinking current and sets the bias current of the differential amplifier circuit. The bias control at the base of the transistor $Q_9$ may be effectively utilized. The input signal for this differential amplifier is applied between the bases of the differential pair npn transistors $Q_1$ and $Q_2$ and the output thereof is derived from the collector of one of the pnp lateral transistors, $Q_4$ (or $Q_3$). A capacitor $C_1$ may preferably be connected as shown by broken lines for preventing oscillation.

In the differential amplifier circuit of the above structure, the emitter voltage of the npn transistor $Q_1$ (or $Q_2$) is supplied to the base of the pnp lateral transistor $Q_3$ (or $Q_4$), which forms an input stage with the differential pair npn transistor $Q_1$ (or $Q_2$), through the emitter-base of the lateral transistor $Q_5$ (or $Q_6$) which serves as a constant voltage element. Therefore, the base of the pnp lateral transistor $Q_3$ (or $Q_4$) is given a constant bias voltage clamped by the base-emitter constant voltage of the transistor $Q_5$ (or $Q_6$) and the transistor $Q_1$ (or $Q_2$) from a base voltage of the transistor $Q_1$ (or $Q_2$). Further, since the transistors $Q_5$ and $Q_6$ are driven with a constant sink current supplied through the transistor $Q_9$, a stabilized bias current is allowed to flow through the differential amplifier. Since the emitter-base paths of the transistors $Q_5$ and $Q_6$ are respectively connected in parallel with the emitter-base paths of the transistors $Q_3$ and $Q_4$, the stability of the biasing for the lateral transistors $Q_3$ and $Q_4$ of the input stage is excellent for changes in the ambient temperature or variations in the electrical characteristics of the pnp transistors. Since the input stage is formed of a complementary bipolar transistor structure including npn transistors and pnp transistors, the range of the differential input voltage is wide. Additionally, phase compensation can be achieved easily by adding a capacitor $C_1$, and the common mode signal rejection ratio can be set large. Further, since the pnp lateral transistors $Q_5$ and $Q_6$ are not connected directly to the voltage source terminal $V_{CC}$, the base-substrate voltage can be reduced to about one half of the conventional value. Although a transistor as a load for the pnp transistors $Q_3$ and $Q_4$ is used in the above embodiment, a passive device, such as a resistor, may be used in place of such an active load.

Further, it will be apparent from the following description that various circuit modifications can be made and that simplification of the structure is possible.

Figure 2:
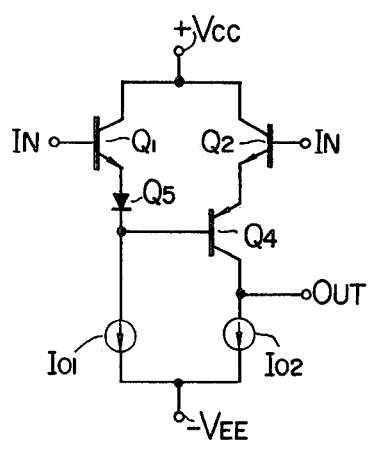
FIG. 2 is a circuit diagram of a differential amplifier according to another embodiment of this invention.

FIG. 2 is a circuit diagram of a differential amplifier according to another embodiment of this invention. In the circuit, the emitter of a pnp lateral transistor $Q_4$ is connected to the emitter of one of the differential pair npn transistors $Q_1$ and $Q_2$, say $Q_2$, and the base thereof is connected to the emitter of the other npn transistor $Q_1$ through a constant voltage element, i.e., a diode $Q_5$ (which may be a lateral transistor having the base and the collector connected in common). The collector of the transistor $Q_4$ is connected to a constant current load circuit $I_{02}$ and the base thereof to a constant current circuit $I_{01}$ for setting the bias current. Namely, this circuit can be considered as a simplified version of the circuit of FIG. 1 with the transistors $Q_3$ and $Q_6$ dispensed with.

Figure 3:
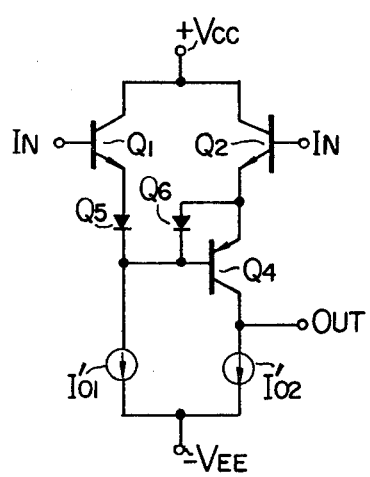
FIG. 3 is a circuit diagram of a modification of the circuit of FIG. 2.

FIG. 3 shows another embodiment in which a diode $Q_6$ is added between the base and the emitter of the transistor $Q_4$ for improving the balance of the differential amplifier of FIG. 2. In this circuit, when the dc current through the collectors of the transistors $Q_1$ and $Q_2$ are respectively two parts, the constant sink current $I_{01}'$ may be three parts and $I_{02}'$ one part.

Further, in the circuit of FIG. 1, the emitter resistors $R_4$ to $R_7$ may be dispensed with if the operation points of the active elements used are suitably selected.

Figure 4:
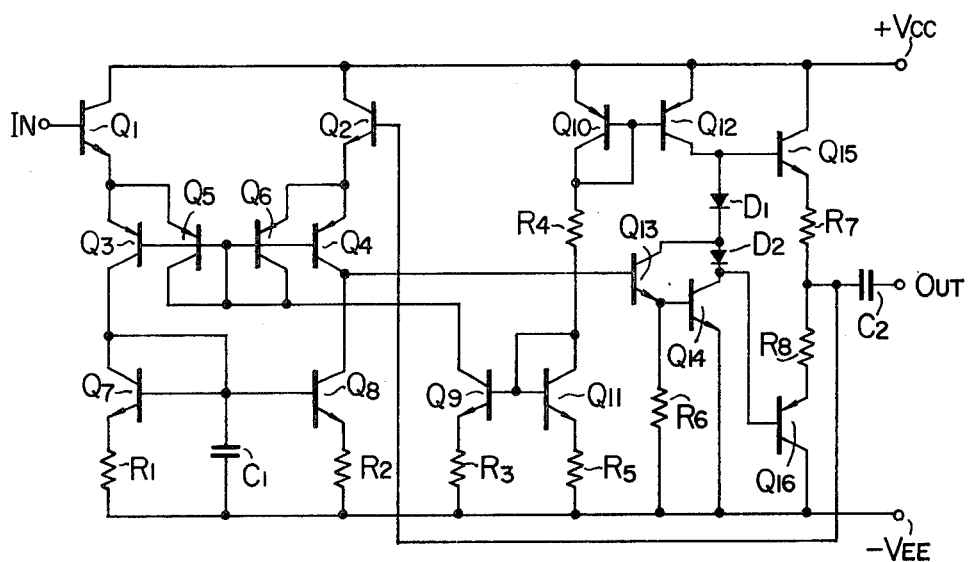
FIG. 4 is a circuit diagram of a pre-amplifier embodying an embodiment of this invention.
Figure 5:
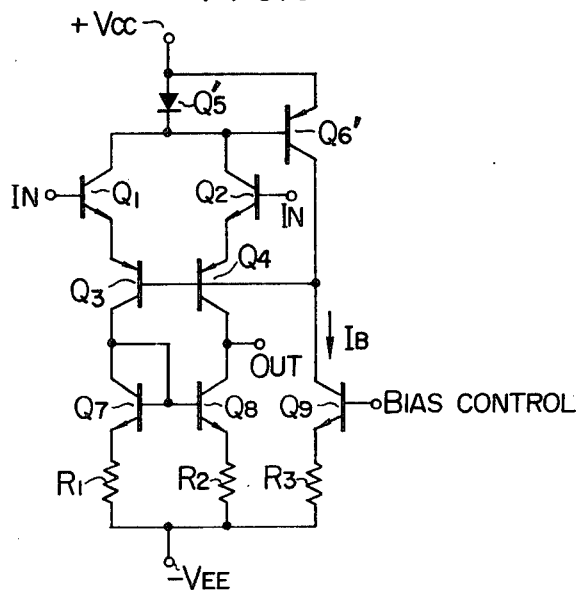
FIG. 5 is a circuit diagram of an example of the conventional differential amplifier.

FIG. 4 shows a circuit of an audio preamplifier embodying an embodiment of the differential amplifier circuit of this invention. The circuit is formed in one silicon chip by integrated circuit technology. The first stage amplifier is formed of a differential amplifier of this invention and the output stage is formed of a push-pull circuit including an npn transistor $Q_{15}$ and a pnp transistor $Q_{16}$. Transistors $Q_{10}$ and $Q_{11}$ and a resistor $R_4$ constitute a common bias line; the transistor $Q_{11}$ biasing the first stage amplifier and the transistor $Q_{10}$ biasing the output stage amplifier. The dc output voltage is negatively fed back to the base of the transistor $Q_2$ so as to reduce the offset voltage. Transistors $Q_{13}$ and $Q_{14}$ are driver transistors for the push-pull circuit.

This invention can be utilized widely as a differential amplifier circuit in, of course, high power operational amplifiers and also other applications.

What is claimed is:
1. A differential amplifier comprising:
an input amplifier stage comprising a first pair of npn transistors having collector electrodes connected to a first voltage supply, base electrodes forming input terminals of said differential amplifier and emitter electrodes, and a second pair of pnp transistors each having an emitter electrode connected to the emitter electrode of a corresponding one of said first pair of npn transistors, a base electrode and a collector electrode;
a third pair of pnp transistors each having a base electrode connected to its collector electrode and having substantially the same operating characteristics as those of said second pair of pnp transistors, each transistor of said third pair of pnp transistors having an emitter electrode connected to the emitter of a corresponding one of said second pair of pnp transistors, each transistor of said third pair of pnp transistors having a base electrode connected to the base electrode of the corresponding one of said second pair of pnp transistors, thereby providing bias currents through said second pair of pnp transistors and compensating for changes in operating characteristics of said second pair of pnp transistors due to temperature fluctuations;
bias circuit means connected to the base electrodes of said third pair of pnp transistors for supplying bias currents therein;
load circuit means connected to the collector electrodes of said second pair of pnp transistors for providing at one of the collector electrodes of said second pair of pnp transistors, differential voltage changes having a correspondence to the variations between input signals applied to said input terminals; and
output means connected to the collector electrode of one of said second pair of pnp transistors for deriv- ing said differential voltage changes as an output signal of said differential amplifier.

2. The differential amplifier according to claim 1, in which said load circuit means comprises a fourth pair of npn transistors having commonly connected base electrodes, with each collector electrode being connected to the corresponding one of the collector electrodes of said second pair of pnp transistors, and emitter electrodes of said fourth pair of npn transistors connected to a second coltage supply of opposite polarity from said first voltage supply, the collector electrode of one of said fourth pair of npn transistors being connected to its base electrode, the collector electrode of the other of said fourth pair of npn transistors being connected to said output means.

3. The differential amplifier according to claim 2, in which a capacitor is connected between the commonly connected base electrodes of said fourth pair of npn transistors and the second voltage supply to provide a phase-compensated output signal at the output means.

4. The differential amplifier according to claim 1, wherein all of said circuit elements are formed on a monolithic semiconductor substrate.

5. The differential amplifier according to claim 1, in which said emitter electrodes of said first pair of npn transistors are connected through respective resistors with the emitter electrodes of said second and third pairs of pnp transistors.

6. The differential amplifier according to claim 1, in which said bias circuit means comprises an npn transistor having a base adapted to receive a bias control signal and a collector connected to said base electrodes of said third pair of pnp transistors.

* * * * *